United States Patent [19]
Marsh et al.

[11] Patent Number: 5,896,063
[45] Date of Patent: Apr. 20, 1999

[54] VARIABLE GAIN AMPLIFIER WITH IMPROVED LINEARITY AND BANDWIDTH

[75] Inventors: James W. H. Marsh, Sherwood; Scott Lindsey Williams, Tigard, both of Oreg.

[73] Assignee: Maxim Integrated Products, Inc., Sunnyvale, Calif.

[21] Appl. No.: 08/846,293

[22] Filed: Apr. 30, 1997

[51] Int. Cl.[6] .................................................. H03F 3/45
[52] U.S. Cl. ................................... 330/254; 327/359
[58] Field of Search .................................. 327/356, 359; 330/252, 253, 254

[56] References Cited

U.S. PATENT DOCUMENTS

| | | | |
|---|---|---|---|
| 4,494,075 | 1/1985 | Yoshida et al. | 330/254 |
| 5,057,787 | 10/1991 | Arai et al. | 330/254 |
| 5,418,494 | 5/1995 | Betti et al. | 330/254 |
| 5,528,197 | 6/1996 | Frey | 330/254 |
| 5,532,637 | 7/1996 | Khoury et al. | 327/359 |

FOREIGN PATENT DOCUMENTS 0 620 639 A1  4/1993  European Pat. Off. .

OTHER PUBLICATIONS

PCT Application No. PCT/US98/07334 International Search Report dated Jul. 9, 1998.
"Bipolar And MOS Analog Integrated Circuit Design", Alan B. Grebene, John Wiley & Sons, Inc., 1984, pp. 445–446.

*Primary Examiner*—Steven J. Mottola
*Attorney, Agent, or Firm*—Blakely, Sokoloff, Taylor & Zafman LLP

[57] ABSTRACT

A variable gain amplifier having improved bandwidth and linearity, and having improved dynamic range by allowing the amplifier to be designed for low noise performance, while retaining the linearity normally lost with low noise designs. The amplifier is of the current steering type, having a differential current steering input stage coupled to a further current steering stage for controlling the gain responsive to a gain control signal. Current is maintained in a pair of common base connected transistors in the output circuit so that these transistors do not create excessive noise or limit the bandwidth and linearity of the amplifier at low gain. Maintaining the current in these transistors responsive to the gain control signal may maintain a substantially constant current in these transistors independent of gain. Exemplary embodiments are disclosed.

14 Claims, 5 Drawing Sheets

VARIABLE GAIN AMPLIFIER WITH IMPROVED LINEARITY AND BANDWIDTH

BACKGROUND OF THE INVENTION

1. Field of the Invention

The present invention relates to the field of variable gain amplifiers.

2. Prior Art

A classic single quadrant variable gain amplifier is shown in FIG. 1. The amplifier consists of a Gm (transconductance) stage comprised of transistors Q1 and Q2, emitter resistors Re and current source Iee, and a current steering stage comprised of transistors Q3 through Q6 loaded by resistors Rl (the phrase current source as used herein and in the claims is used in the general sense to designate both current source and sinks, as is common in the art).

An input signal Vin generates output currents $i_1$ and $i_2$ via the Gm stage, where $i_1+i_2=$Iee. By setting the gain control voltage $V_G$, an appropriate percentage of the currents $i_1$ and $i_2$ is impressed upon the load resistors Rl, generating the output voltage Vo. The remainder of the currents $i_1$ and $i_2$ are shunted to the common mode supply through transistors Q4 and Q5. In the analyses to follow, the base currents of the transistors are assumed to be zero for analytical convenience.

The simple stage of FIG. 1 can generate a large variable gain range by proper choice of the range of the control voltage $V_G$, though correct transistor area choice is critical to achieve dynamic range requirements. Also this amplifier topology can generate a large quantity of noise, especially in the high gain scenario where the majority of the currents $i_1$ and $i_2$ is steered to the load resistors $R_L$. Transistors Q3 through Q6 contribute a large quantity of noise, hence these devices must be quite large, relative to the bias currents used in the stage. As the gain of the stage is decreased, lowering the signal (and bias) current of the current steering transistors Q3 and Q6, the bandwidth of the stage degrades, resulting in amplifier bandwidth that is dependent upon the gain of the stage. This is not desirable in a high bandwidth, variable gain amplifier.

Simply adding common base connected transistors to the variable gain amplifier, as shown in FIG. 2, helps the problem some, but does not solve the problem. The wide variation in bias, as well as signal current, will result in degraded bandwidth with decreasing gain. This addition also introduces non-linear effects due to the highly variable bias conditions of the common base stage, which directly impacts the input impedance of the transistors, presenting a highly variable load to the variable gain amplifier. Both the real and imaginary components of this load will change. At some gain settings, the component values will be undesirable for the current steering stage, impacting linearity and stability, generating harmonic and oscillatory spurs.

BRIEF SUMMARY OF THE INVENTION

The present invention is a variable gain amplifier having improved bandwidth and linearity, and having improved dynamic range by allowing the amplifier to be designed for low noise performance, while retaining the linearity normally lost with low noise designs. The amplifier is of the current steering type, having a differential current steering input stage coupled to a further current steering stage for controlling the gain responsive to a gain control signal. Current is maintained in a pair of common base connected transistors in the output circuit so that these transistors do not create excessive noise or limit the bandwidth and linearity of the amplifier at low gain. Maintaining the current in these transistors responsive to the gain control signal may maintain a substantially constant current in these transistors independent of gain. Exemplary embodiments are disclosed.

DETAILED DESCRIPTION OF THE INVENTION

Figure 1:
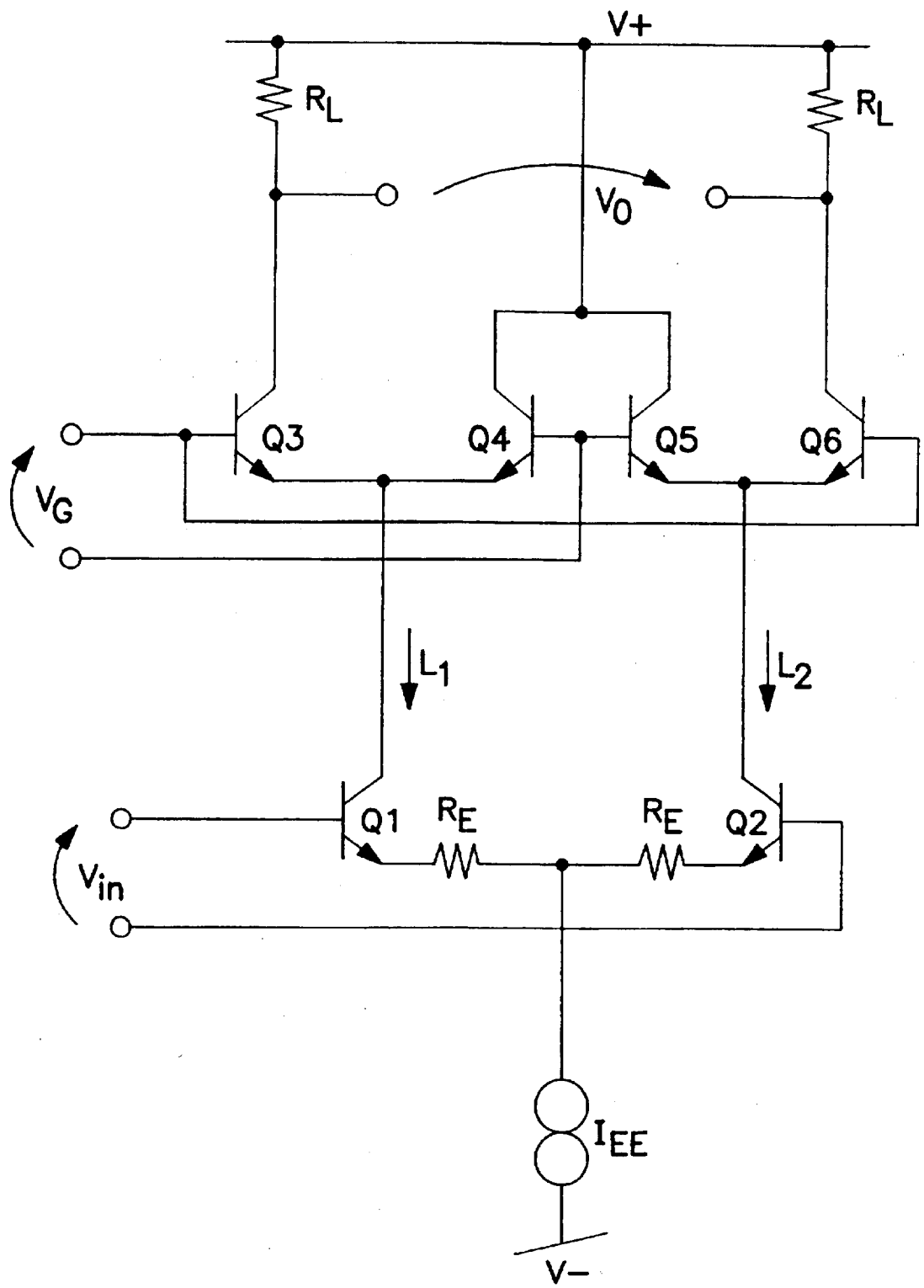
FIG. 1 is a circuit diagram for a typical prior art single quadrant variable gain amplifier.
Figure 2:
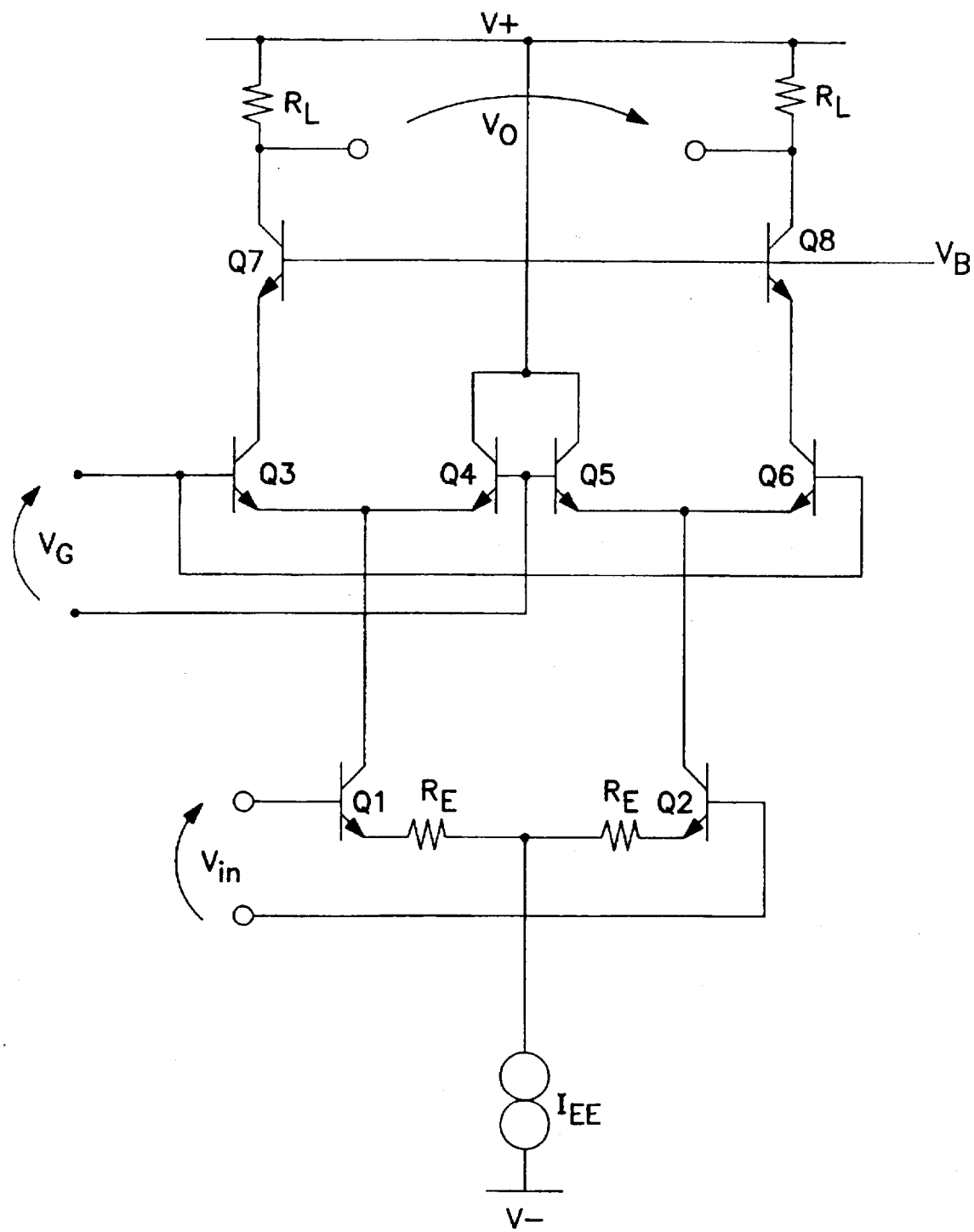
FIG. 2 is a circuit diagram similar to that of FIG. 1, though with the addition of common base connected transistors to the variable gain amplifier.
Figure 3:
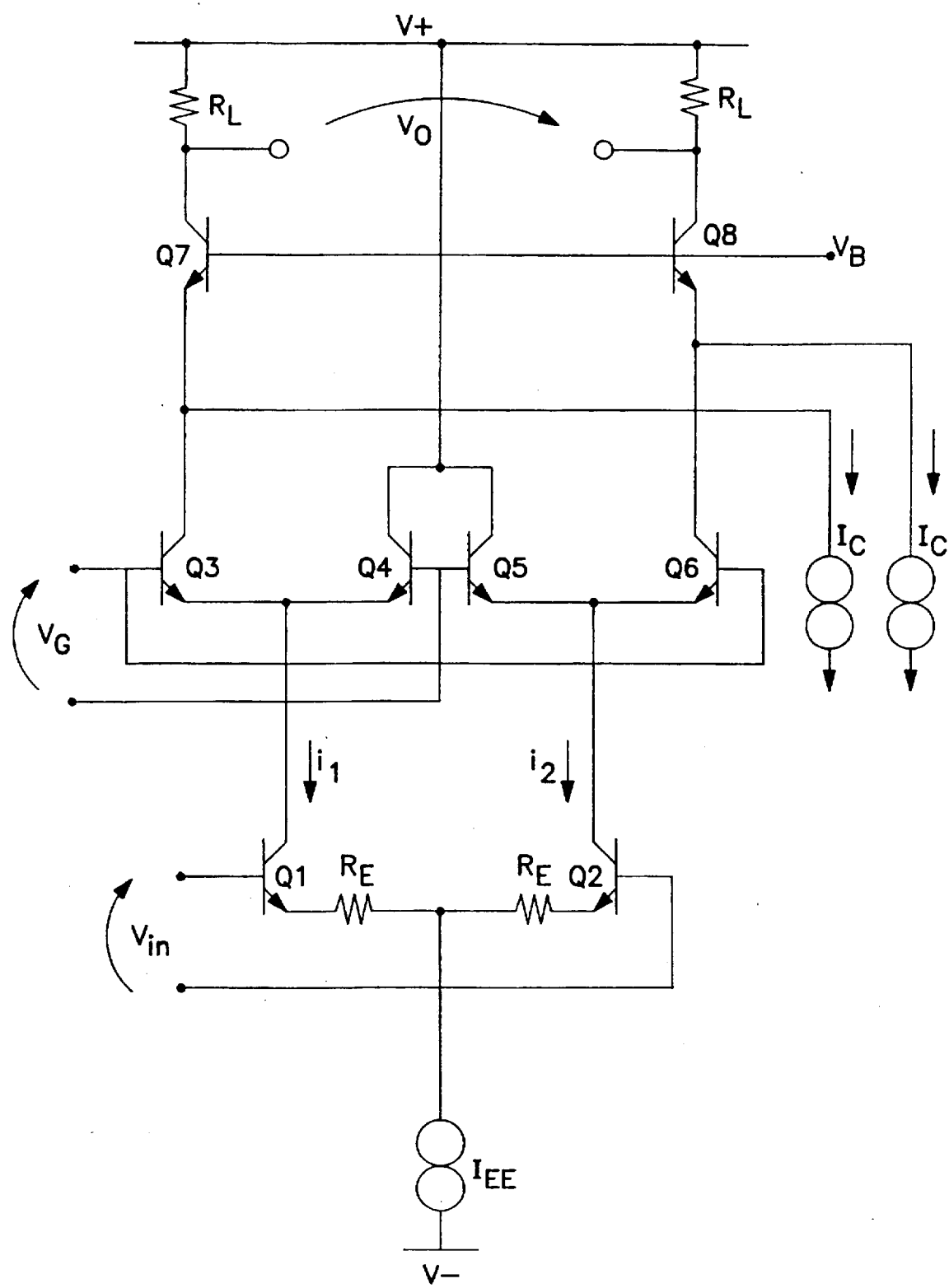
FIG. 3 is a circuit diagram for one embodiment of the present invention.

Now referring to FIG. 3, one embodiment of the present invention may be seen. As shown therein, the present invention adds common base transistors Q7 and Q8, as well as shunting current sources $I_C$ adding additional emitter currents to the common base connected transistors Q7 and Q8. Transistors Q7 and Q8 have their bases biased by a fixed bias voltage $V_B$. By properly choosing the magnitude of the bias currents $I_C$, it is possible to control the variation of total bias currents to the common base transistors Q7 and Q8, thus preserving necessary bandwidth for the stage, independent of the gain setting. This addition also minimizes the changes of input impedance to the common base connected transistors Q3 and Q6, providing a more constant load to the current steering portion of the variable gain amplifier, thereby enhancing both linearity and stability.

As before, the differential transconductance amplifier comprising transistors Q1 and Q2, emitter resistors $R_E$ and current source IEE, is responsive to the input voltage $V_{in}$ to determine the division of the current $I_{EE}$ between transistors Q1 and transistors Q2, maintaining $i_1+i_2=I_{EE}$. The collector currents $i_1$ and $i_2$ in transistors Q1 and Q2, respectively, are further subdivided by transistors Q3 and Q4, and transistors Q5 and Q6, respectively. Because the gain control voltage $V_G$ is applied between the common base connections of transistors Q3 and Q6, and transistors Q4 and Q5, the gain control voltage $V_G$ will provide some fraction of the current $i_1$ through transistor Q3, with the remaining part of current $i_1$ being provided directly from the V+ rail through transistor Q4. The same fraction of the current $i_2$ will be provided by transistor Q6, with the rest thereof being provided directly from the V+ rail through transistor Q5.

With transistors Q4 and Q5 substantially off, the amplifier will be at its maximum gain, with the collector current in transistors Q3 and Q6 being substantially equal to the currents $i_1$ and $i_2$, respectively. As the other extreme is approached, only a small fraction of the currents $i_1$ and $i_2$ will be supplied by transistors Q3 and Q6, the rest coming directly from the V+ rail through transistors Q4 and Q5. The current sources $I_C$, however, maintain adequate current in the common base connected transistors Q7 and Q8 so that their bias does not change drastically with wide changes in gain of the amplifier, and more particularly so that their bias currents do not drastically drop when the variable gain amplifier is operated under low gain conditions. Assuming that the circuit is well matched, the currents $I_C$ in the load resistors $R_L$ provide a common mode voltage level for the output voltage $V_O$, not affecting the differential output voltage on the output terminals $V_O$.

The additional current sources $I_C$ can take various forms. By way of example, they may be standard constant (temperature independent) current sources or sources proportional to absolute temperature (PTAT). They may also be variable current sources, controllable, by way of example, by the variable gain voltage $V_G$, such as in the embodiment of the invention shown in FIG. 4. In this embodiment, current sources $I_C$ of the embodiment of FIG. 3 are provided by the collector currents in transistors Q10 and Q11, which together with the collector current of Q9 is equal to the current source $I_{EE}$, which in this embodiment is equal to the current source coupled to the emitters of transistors Q1 and Q2 of the differential transconductance input stage of the variable gain amplifier.

Figure 4:
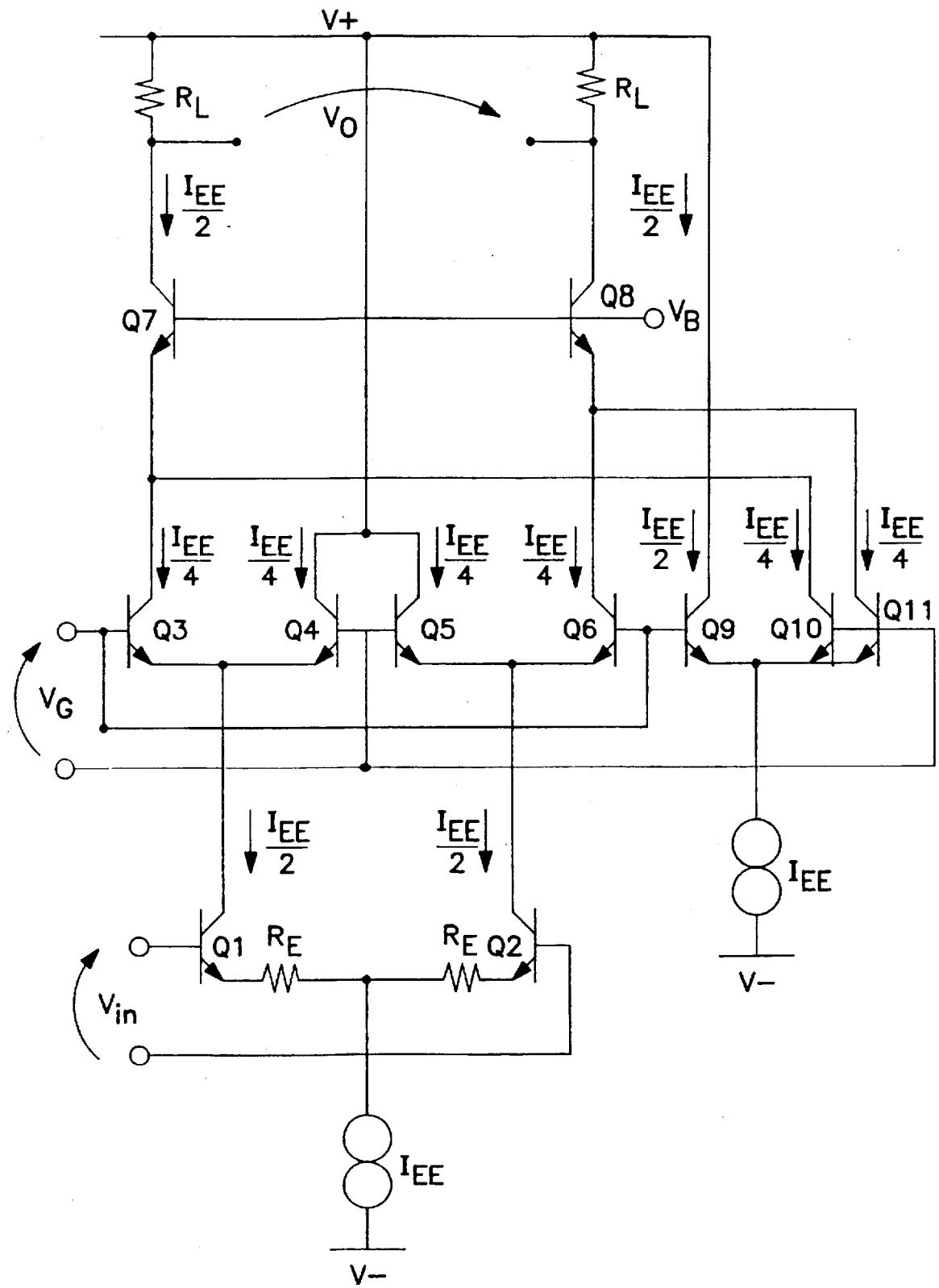
FIG. 4 is a circuit diagram for a second embodiment of the present invention using variable current sources controllable by the variable gain voltage $V_G$ for the additional current sources.

The operation of the circuit of FIG. 4 will of course depend upon the relative transistor sizes. However, consider an example wherein transistors Q3, Q4, Q5, Q6, Q10 and Q11 are identical transistors, and transistor is Q9 is twice the size of those identical transistors. Also consider initially, a zero input voltage $V_{in}$ and a zero gain control voltage $V_G$. Because of the zero differential input voltage $V_{in}$, the current of current source $I_{EE}$ will divide equally between the collectors of transistors Q1 and Q2. These components, in turn, will further divide equally between transistors Q3 and Q4, and transistors Q5 and Q6, respectively, so that the collector currents in transistors Q3 and Q6 are each $I_{EE}/4$. With respect to transistors Q9, Q10 and Q11, the current source $I_{EE}$ will divide, with current $I_{EE}/4$ in transistors Q10 and Q11, and because transistor Q9 is twice the size of each of transistors Q10 and Q11, transistor Q9 will have a current $I_{EE}/2$.

Now, by way of example, if the gain control voltage $V_G$ is changed from zero to some value wherein the voltage on the bases of transistors Q3 and Q6 is less than the voltage on the bases of transistors Q4 and Q5, the gain of the amplifier will be reduced, and some of the bias current in transistors Q3 and Q6 will be shifted to transistors Q4 and Q5. At the same time, however, the change of the voltage of the bases of transistors Q3 and Q6 also reduces the base voltage of transistor Q9, reducing the bias current there through and increasing the bias current in transistors Q10 and Q11. The bias current increase in transistors Q10 and Q11 will equal the bias current decrease in transistors Q3 and Q6, so that the bias current in transistors Q7 and Q8 will remain substantially at $I_{EE}/2$, independent of the gain setting for the circuit. Thus, transistors Q7 and Q8 are substantially unaffected by the variation in gain, and more importantly, are not subject to the deleterious affects in circuit performance caused by operation at very low gain values.

Figure 5:
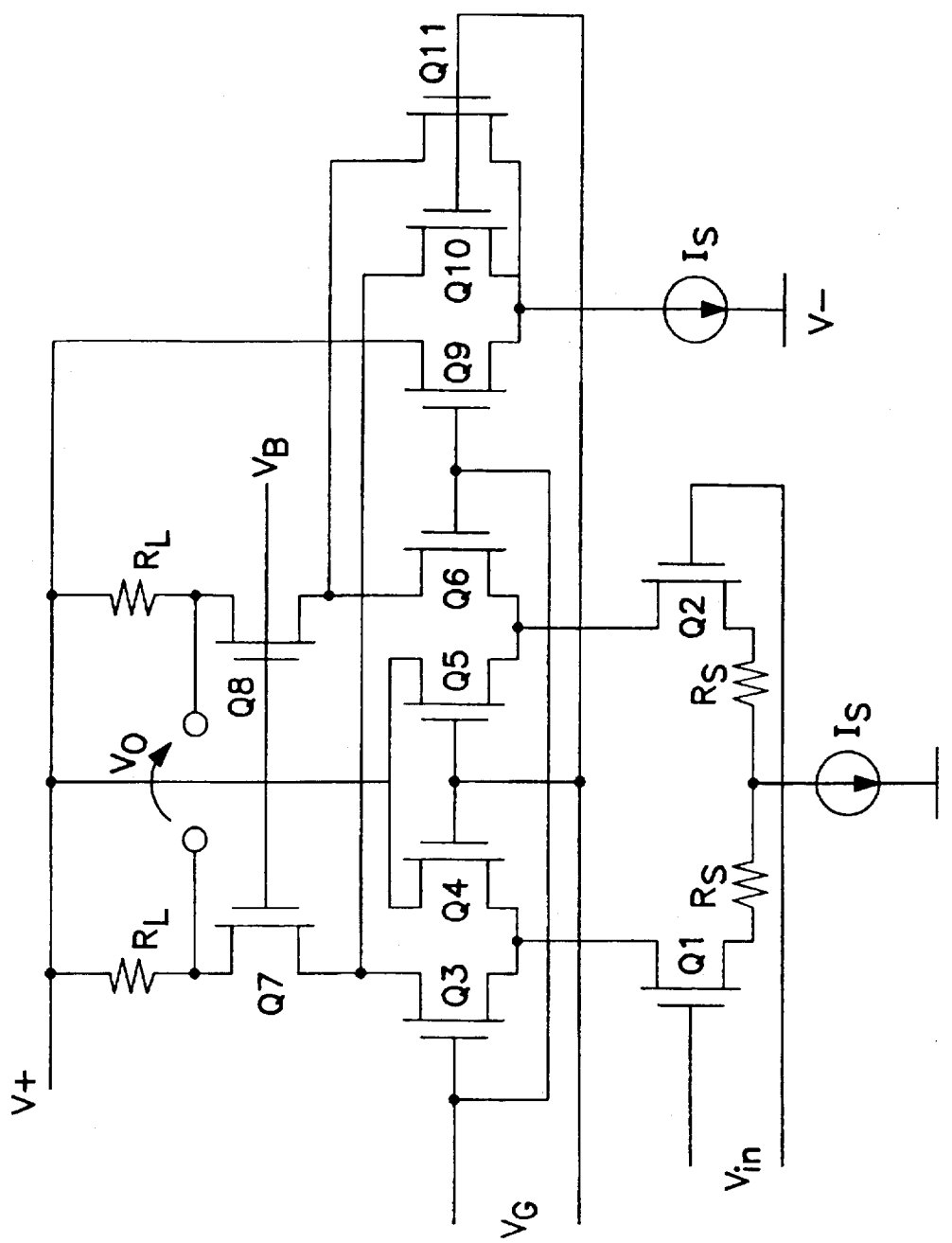
FIG. 5 is a circuit diagram similar to that of FIG. 4, but using field effect transistors rather than bipolar transistors.

The present invention is applicable to current steering variable gain amplifiers realized both in bipolar and MOS technologies. By way of example, FIG. 5 is a circuit diagram similar to FIG. 4, but showing the use of n-channel MOSFETs in place of the bipolar transistors of FIG. 4. Because the two current sources provide the source current for transistors Q1 and Q2, and transistors Q9, Q10 and Q11, respectively, the same have been labeled $I_S$. Similarly, the resistors in series with the sources of transistors Q1 and Q2 have been labeled $R_S$. Otherwise the remaining components in FIG. 5 have been given the same device identifications as in the bipolar version of FIG. 4, as even though the field effect devices have somewhat different characteristics than the bipolar devices of FIG. 4, the field effect devices function in the circuit of FIG. 5 in the same manner as described herein with respect to the bipolar devices of FIG. 4, and accordingly the description hereinbefore given is as applicable to FIG. 5 as to FIG. 4.

Of course, instead of using npn transistors as shown in FIG. 4 or n-channel devices in FIG. 5, pnp transistors or p-channel devices could be used, as is well known in the art. Further, the present invention could be realized using transistors of different types, such as by way of simply one example, using n-channel transistors for transistors Q1 and Q2, and npn transistors for the rest of the transistors, though use of mixed transistor types is not preferred.

While the present invention has been disclosed and described with respect to a certain preferred embodiment thereof, it will be understood to those skilled in the art that the present invention may be varied without departing from the spirit and scope thereof.

What is claimed is:

1. In a variable gain amplifier wherein the combination of a signal being amplified and a bias current are together controllably steered through a first connection to a load device responsive to a gain control signal, the improvement comprising:

a transistor having a first region coupled to the load device and an output, a second region coupled to the first connection, and a control electrode coupled to a reference voltage for controlling the current flow between the first and second regions responsive to the voltage between the control electrode and the second region; and a current source coupled to the second region of the transistor to provide additional current through the first connection when the signal and the bias current steered through the first connection are a minimum, the current source also responsive to the gain control signal to increase the additional current through the transistor when the signal and the bias current in the first connection decreases, and to decrease the additional current through the transistor when the signal and the bias current in the first connection increases, to maintain the combination of the bias current and the additional current through the transistor substantially constant, independent of the gain control signal.

2. The improvement of claim 1 wherein the transistor is an npn bipolar transistor.

3. The improvement of claim 1 wherein the transistor is a MOS transistor.

4. In a variable gain amplifier wherein the combination of a controllable part of each of complementary signals being amplified and a respective corresponding part of a bias current are together steered through first and second connections, respectively, to first and second load devices, respectively, responsive to a gain control signal, the improvement comprising:

a first transistor including a first region coupled to the first load device and a first output, a second region coupled to the first connection, and a control electrode coupled to a reference voltage for controlling the current flow between the first and second regions responsive to the voltage between the control electrode and the second region;

a second transistor including a first region coupled to the second load device and a second output, a second region coupled to the second connection, and a control electrode coupled to the reference voltage for controlling the current flow between the first and second regions responsive to the voltage between the control electrode and the second region; and first and second current sources coupled to the first and second connections, the current sources providing additional currents through the first and second transistors when the signal and the bias currents in the first and second connections are a minimum, the current sources are also responsive to the gain control signal to increase the additional currents through the first and second transistors when the signals and the bias currents in the first and second connections decrease, and to decrease the additional currents through the first and second transistors when the signals and the bias currents in the first and second connections increase, to maintain the combination of the bias currents and the additional currents through the first and second transistors substantially constant, independent of the gain control signal.

5. The improvement of claim 4 wherein the transistors are npn bipolar transistors.

6. The improvement of claim 4 wherein the transistors are MOS transistors.

7. A variable gain amplifier comprising:

first and second power supply connections;

first through eleventh transistors, each having a first and a second region and a control electrode for controlling the current flow between the first and second regions responsive to the voltage between the control electrode and the second region;

first and second current sources;

first and second load devices;

the second region of the first and second transistors being coupled together, and to the second power supply connection through the first current source;

the second region of the third and fourth transistors being coupled together and to the first region of the first transistor;

the second region of the fifth and sixth transistors being coupled together and to the first region of the second transistor;

the first region of the fourth and fifth transistors being coupled together and to the first power supply connection;

the second region of the ninth, tenth and eleventh transistors being coupled together and to the second power supply connection through the second current source;

the first region of the third transistor being coupled to the second region of the seventh transistor and to the first region of the tenth transistor;

the first region of the sixth transistor being coupled to the second region of the eighth transistor and to the first region of the eleventh transistor;

the first region of the ninth transistor being coupled to the first power supply connection;

the control electrodes of the first and second transistors providing signal input connections;

the control electrodes of the third, sixth and ninth transistors being coupled together to form a gain control connection;

the control electrodes of the fourth, fifth, tenth and eleventh transistors being coupled together to form a second gain control connection;

the control electrodes of the seventh and eighth transistors being coupled together and to a bias input connection;

the first region of the seventh transistor being coupled to the first power supply connection through the first load device and forming one output connection; and, the first region of the eighth transistor being coupled to the first power supply connection through the second load device and forming a second output connection.

8. The variable gain amplifier of claim 7 further comprising:

first and second resistors coupled between the second region of the first and second transistors, respectively, and the first current source.

9. The variable gain amplifier of claim 7 wherein the first through eleventh transistors are bipolar transistors.

10. The variable gain amplifier of claim 7 wherein the first through eleventh transistors are MOS transistors.

11. A variable gain amplifier comprising:

first and second power supply terminals;

first, second, and third current sources;

a first transistor having a first region, a second region, and a control electrode coupled to a first input terminal;

a second transistor having a first region, a second region coupled to the second region of the first transistor and to the second power supply terminal through the first current source, and a control electrode coupled to a second input terminal;

a third transistor having a first region, a second region coupled to the first region of the first transistor, and a control electrode coupled to a first gain control terminal;

a fourth transistor having a first region coupled to the first power supply terminal, a second region coupled to the second region of the third transistor and the first region of the first transistor, and a control electrode coupled to a second gain control terminal;

a fifth transistor having a first region coupled to the first region of the fourth transistor and the first power supply terminal, a second region coupled to the first region of the second transistor, and a control electrode coupled to the control electrode of the fourth transistor;

a sixth transistor having a first region, a second region coupled to the second region of the fifth transistor, and a control electrode coupled to the first gain control terminal;

a seventh transistor having a first region coupled to the first power supply terminal through a first load device and forming a first output connection, a second region coupled to the first region of the third transistor and to the second power supply terminal through the second current source, and a control electrode coupled to a bias input terminal; and an eighth transistor having a first region coupled to the first power supply terminal through a second load device and forming a second output connection, a second region coupled to the first region of the sixth transistor and to the second power supply terminal through the third current source, and a control electrode coupled to the bias input terminal.

12. The variable gain amplifier of claim 11 further comprising:

first and second resistors coupled between the second region of the first and second transistors, respectively, and the first current source.

13. The variable gain amplifier of claim 11 wherein the first through eleventh transistors are bipolar transistors.

14. The variable gain amplifier of claim 11 wherein the first through eleventh transistors are MOS transistors.

* * * * *